United States Patent
Sayanagi et al.

(10) Patent No.: US 6,847,275 B2
(45) Date of Patent: Jan. 25, 2005

(54) HIGH-FREQUENCY CIRCUIT BOARD UNIT, HIGH FREQUENCY MODULE USING THE SAME UNIT, ELECTRONIC APPARATUS USING THE SAME MODULE, AND MANUFACTURING METHOD FOR THE HIGH-FREQUENCY CIRCUIT BOARD UNIT

(75) Inventors: Kazuya Sayanagi, Osaka (JP); Akihiro Sasabata, Yokohama (JP); Yutaka Sasaki, Yokohama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/974,668

(22) Filed: Oct. 10, 2001

(65) Prior Publication Data

US 2002/0072147 A1 Jun. 13, 2002

(30) Foreign Application Priority Data

Oct. 24, 2000 (JP) .......................... 2000-324080

(51) Int. Cl.[7] .................. H01L 21/58; H01P 3/08
(52) U.S. Cl. .................. 333/247; 333/204; 257/728
(58) Field of Search ................ 333/204, 247, 333/33, 12; 257/728; 361/820, 818

(56) References Cited

U.S. PATENT DOCUMENTS 5,510,758 A  4/1996 Fujita et al. ............. 333/247
6,043,727 A * 3/2000 Warneke et al. ........... 333/205
6,359,536 B1 * 3/2002 Sakamoto et al. .......... 333/246

FOREIGN PATENT DOCUMENTS

JP    6-236937    8/1994
JP    07074285    3/1995

OTHER PUBLICATIONS

European Search Report dated May 30, 2002.
Japanese Office Action issued Oct. 12, 2004 (w/ English translation of relevant portions).

* cited by examiner

*Primary Examiner*—Stephen E. Jones
(74) *Attorney, Agent, or Firm*—Dickstein, Shapiro, Morin & Oshinsky, L.L.P.

(57) ABSTRACT

A ground electrode and a terminal electrode are formed on a first main surface of dielectric substrate forming a circuit board. Wiring electrodes are formed on a second main surface of the dielectric substrate. A semiconductor device and a filter are mounted on the wiring electrodes. A strip line electrode of the filter is connected to the ground electrode of the circuit board for conducting direct current, via a through-hole provided in the filter, a ground electrode of the filter, the wiring electrode, and a through-hole provided in the circuit board. With this arrangement, the terminal electrode is connected to a high-frequency signal terminal of the semiconductor device via the filter.

13 Claims, 6 Drawing Sheets

HIGH-FREQUENCY CIRCUIT BOARD UNIT, HIGH FREQUENCY MODULE USING THE SAME UNIT, ELECTRONIC APPARATUS USING THE SAME MODULE, AND MANUFACTURING METHOD FOR THE HIGH-FREQUENCY CIRCUIT BOARD UNIT

BACKGROUND OF THE INVENTION

1. Field of the Invention

The present invention relates to a high-frequency circuit board unit, a high-frequency module using the same unit, and an electronic apparatus using the same module. The invention also relates to a manufacturing method for the above-described high-frequency circuit board unit.

2. Description of the Related Art

FIG. 11 is a sectional view illustrating a conventional high-frequency circuit board unit. In FIG. 11, a high-frequency circuit board unit 1 includes a circuit board 2, a semiconductor device 8, and a filter 15 which serves as a passive impedance circuit device. The circuit board 2 has a dielectric substrate 3, which is formed of a dielectric material, such as an alumina substrate, having a comparatively low dielectric constant (of about 9 to 10). A ground electrode 4 and terminal electrodes 5a, 5b are formed on a first main surface of the dielectric substrate 3. Wiring electrodes 6a, 6b, 6c, 6d are formed on a second main surface of the dielectric substrate 3. The wiring electrodes 6a, 6d are connected respectively to the terminal electrodes 5a, 5b via respective through-holes 7a, 7b. The semiconductor device 8 is mounted on the second main surface of the dielectric substrate 3, and the wiring electrodes 6a, 6b are connected respectively to connecting lands 8b, 8a formed on the semiconductor device 8 via wires (bonding wires) 10. The filter 15 is mounted on the wiring electrode 6c formed on the second main surface of the dielectric substrate 3. The filter 15 is formed of a dielectric substrate 16 and a strip line electrode 17 is formed on the wiring electrode 6c and provided with a filtering function. The strip line electrode 17 and the wiring electrode 6d are connected to each other via a wire 10.

According to the high-frequency circuit board unit 1 constructed as described above, both the semiconductor device 8, which is an active device, and the filter 15, which is a passive device, are mounted on the circuit board 2. Accordingly, the circuit board unit 1 can be operated as a component having one function.

Generally, however, the semiconductor device 8, in particular, a GaAs semiconductor device, has a low breakdown voltage, and an electrostatic surge voltage may cause electrostatic discharge damage to the semiconductor device 8. Accordingly, in the high-frequency circuit board unit 1, if, for example, an electrostatic surge voltage is applied to the semiconductor device 8 via a signal line formed of the terminal electrode 5a, the through-hole 7a, the wiring electrode 6a, and the wire 10, the high-frequency circuit board unit 1 may be damaged.

In particular, in a wireless-communication transceiver module using such a high-frequency circuit board unit, a terminal electrode connected to an antenna is exposed. Thus, if a surge voltage is applied to the circuit board unit via this terminal electrode, the semiconductor device may be damaged.

On the other hand, a surge voltage applied to the terminal electrode 5b via the filter 15 does not damage the semiconductor device 8 as long as the filter 15 is provides insulation between the input and output terminals.

Thus, in a semiconductor assembly line, for example, in which the semiconductor device 8 is mounted on the circuit board 2, sufficient measures must be taken against electrostatic damage regardless of the presence or the absence of the filter 15. However, this increases the cost of carrying out the process steps.

One way of protecting against electrostatic damage is to connect a surge-voltage protecting diode to a signal terminal of a semiconductor device. With this measure, however, the semiconductor device becomes expensive, and the diode may cause the loss of a high-frequency signal.

SUMMARY OF THE INVENTION

To solve the above-described problems, the present invention provides a high-frequency circuit board unit having a high breakdown voltage and thereby protected against an electrostatic surge voltage, a high-frequency module using such a high-frequency circuit board unit, an electronic apparatus using such a high-frequency module, and a manufacturing method for the high-frequency circuit board unit.

According to one aspect of the present invention, there is provided a high-frequency circuit board unit including a circuit board having a ground electrode and a terminal electrode. A semiconductor device is mounted on the circuit board, and includes a high-frequency signal terminal for sending and receiving a high-frequency signal to and from the terminal electrode of the circuit board. At least one of the terminal electrode of the circuit board and the high-frequency signal terminal of the semiconductor device is connected to the ground electrode of the circuit board for conducting direct current.

The aforementioned high-frequency circuit board unit may further include a passive impedance circuit device mounted on the circuit board and connected between the high-frequency signal terminal and the terminal electrode. One of the high-frequency signal terminal and the terminal electrode may be connected to the ground electrode for conducting direct current via the passive impedance circuit device.

Alternatively, the aforementioned high-frequency circuit board unit may further include a passive impedance circuit device mounted on the circuit board and connected between the high-frequency signal terminal and the terminal electrode. Both the high-frequency signal terminal and the terminal electrode may be connected to the ground electrode for conducting direct current via the passive impedance circuit device.

The passive impedance circuit device may be formed on a dielectric substrate having a dielectric constant higher than that of a material of the circuit board or of the semiconductor device.

The semiconductor device may be bump-mounted on the circuit board.

An electrostatic protecting diode may be provided for a terminal other than the high-frequency signal terminal of said semiconductor device.

According to another aspect of the present invention, there is provided a high-frequency module including the above-described high-frequency circuit board unit. The high-frequency module may have a cover. The circuit board may be used as a component mounting board for other components, and the terminal electrode may be used as an external terminal.

According to still another aspect of the present invention, there is provided an electronic apparatus including the above-described high-frequency circuit board unit or the aforementioned high-frequency module.

According to a further aspect of the present invention, there is provided a manufacturing method for a high-frequency circuit board unit. The manufacturing method includes the steps of: mounting, on a circuit board having a ground electrode and a terminal electrode, a passive impedance circuit device, at least one terminal of which is connected to the ground electrode for conducting direct current, in such a manner that at least one terminal is connected to the terminal electrode; and mounting a semiconductor device having a high-frequency signal terminal on the circuit board in such a manner that the high-frequency signal terminal is connected to the other terminal of the passive impedance circuit device.

In the aforementioned manufacturing method, the passive impedance circuit device and the semiconductor device may be bump-mounted on the circuit board.

At least one terminal of said passive impedance circuit device may be connected to said ground electrode after said semiconductor device is mounted on said circuit board.

Further, at least one terminal of said passive impedance circuit device may be connected to said ground electrode before said high-frequency signal terminal is connected to said other terminal of said passive impedance circuit device.

The high-frequency circuit board unit, the high-frequency module, and the electronic apparatus of the present invention provide a high breakdown voltage against an electrostatic surge voltage. Thus, the reliability can be improved, and the size of the high-frequency circuit board unit can be reduced.

According to the manufacturing method for the high-frequency circuit board of the present invention, the possibility of electrostatic discharge damage while manufacturing the semiconductor device can be reduced. As a result, the manufacturing process can be simplified, and the cost of the high-frequency circuit board unit can be reduced.

Other features and advantages of the present invention will become apparent from the following description of embodiments of the invention which refers to the accompanying drawings.

DESCRIPTION OF EMBODIMENTS OF THE INVENTION

Figure 1:
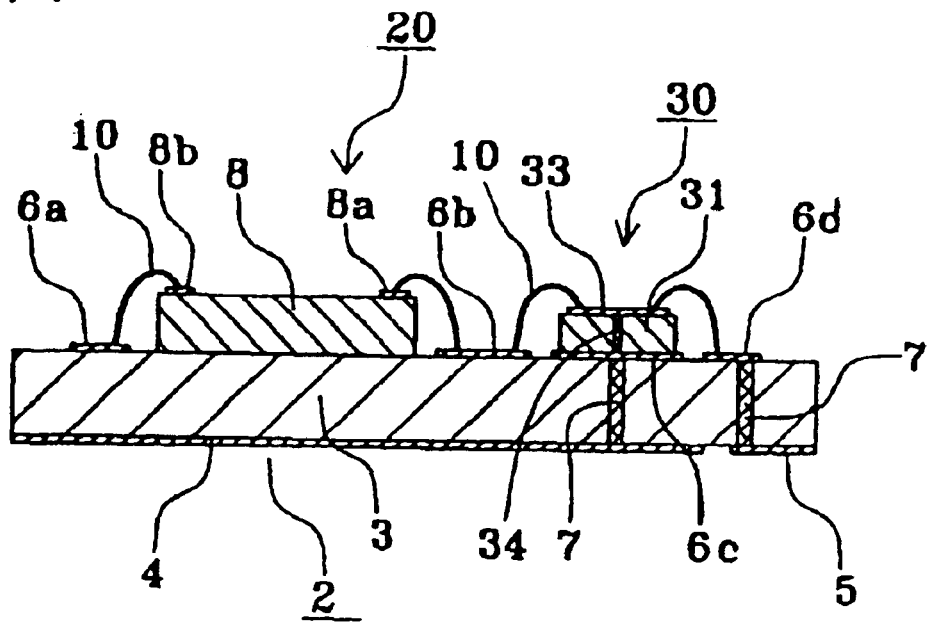
FIG. 1 is a sectional view illustrating a high-frequency circuit board unit according to an embodiment of the present invention.
Figure 11:
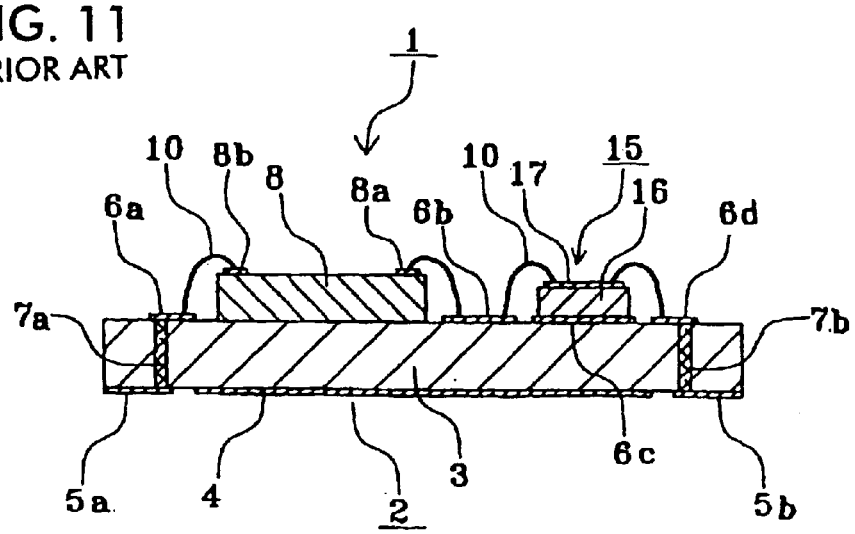
FIG. 11 is a sectional view illustrating a conventional high-frequency circuit board unit.

FIG. 1 is a sectional view illustrating a high-frequency circuit board unit according to an embodiment of the present invention. In FIG. 1, elements the same as or similar to those of FIG. 11 are designated with like reference numerals, and an explanation thereof will thus be omitted.

In a high-frequency circuit board unit 20 shown in FIG. 1, the semiconductor device 8 and a filter 30, which serves as a passive impedance circuit device, are connected to a plurality of wiring electrodes 6a, 6b, 6c, 6d which are formed on the second main surface of the dielectric substrate 3. Unlike the conventional high-frequency circuit board unit 1 shown in FIG. 11, the wiring electrode 6a connected to the connecting land 8b via the wire 10 is not connected to a terminal electrode on the first main surface of the dielectric substrate 3.

Figure 2:
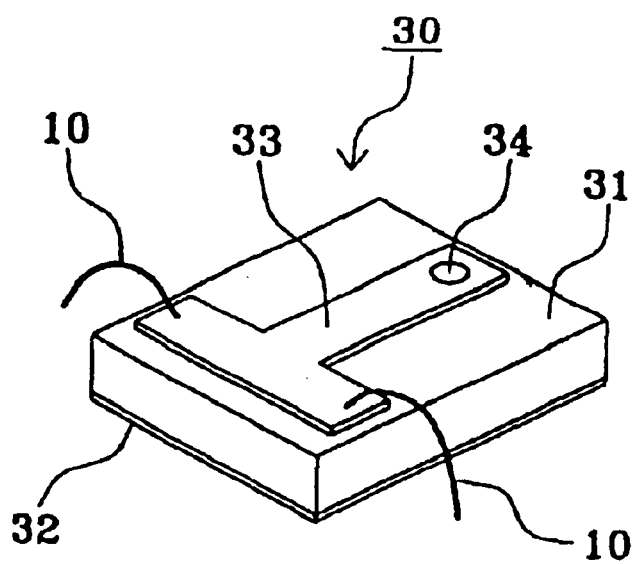
FIG. 2 is a perspective view illustrating an example of a filter mounted on a high-frequency circuit board unit of the present invention.

FIG. 2 is a perspective view illustrating the filter 30. In FIG. 2, the filter 30 includes a dielectric substrate 31, a ground electrode 32, a strip line electrode 33, and a through-hole 34. The dielectric substrate 31 has a dielectric constant of, for example, 110, higher than that of the material of the dielectric substrate 3 (having a dielectric constant of about 9 if it is an alumina substrate) or the material of the semiconductor device 8 (having a dielectric constant of about 12.5 if it is a GaAs device). The ground electrode 32 is formed on the first main surface of the dielectric substrate 31. The strip line electrode 33 is formed on the second main surface of the dielectric substrate 31. The through-hole 34 is used for connecting the ground electrode 32 and the strip line electrode 33. The strip line electrode 33 is formed of a line and a ¼-wavelength stub connected to the central portion of the line. The forward end of the stub is connected to the ground electrode 32 by the through-hole 34, and is thus grounded. Accordingly, the stub serves as a short stub. The two ends of the line, which serve as an input terminal and an output terminal, are connected to the wiring electrodes 6b, and 6d of the high-frequency circuit board unit 20 shown in FIG. 1 via the wires 10.

The above-configured filter 30 serves as a band-pass filter which allows a specific frequency corresponding to the length of the short stub to pass there through. Since the forward end of the short stub is connected to the ground electrode 32 via the through-hole 34, the input and output terminals (connected to the input/output wires) of the filter 30 are connected to the ground electrode 32 for conducting direct current.

In the filter 30, the strip line electrode 33 is formed on the dielectric substrate 31 having a dielectric constant that is much higher than that of the material of the dielectric substrate 3 or the semiconductor device 8. In this case, the wavelength shortening coefficient which is applied to the strip line electrode 33 becomes much higher than if the strip line electrode were directly formed on the dielectric substrate 3 or the semiconductor device 8, thereby significantly reducing the size of the line electrode. As a result, the filter 30 can be significantly miniaturized.

A manufacturing method for the high-frequency circuit board unit 20 shown in FIG. 1 is described below with reference to FIGS. 3A and 3B. Elements the same as or similar to those shown in FIG. 1 and FIG. 2 are indicated by like reference numerals, and an explanation thereof will thus be omitted.

Figure 3A:
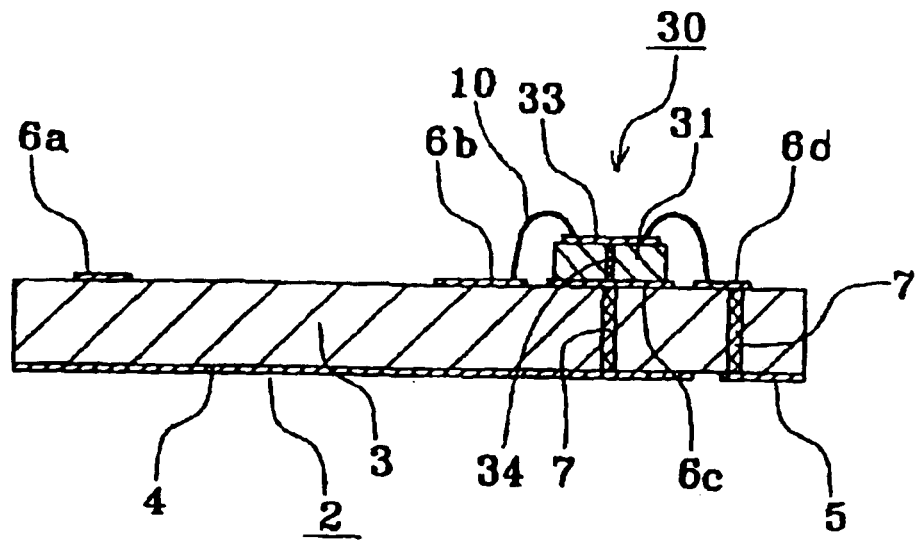
FIG. 3A illustrates a manufacturing process for a high-frequency circuit board unit of the present invention in which the filter shown in FIG. 2 is mounted on a circuit board.

In a first process step, as shown in FIG. 3A, the filter 30 is mounted on the predetermined wiring electrode 6c, which is connected to the ground electrode 4 of the circuit board 2 via the through-hole 7, and the input/output terminals of the filter 30 are connected to the wiring electrodes 6b and 6d on the circuit board 2 by the wires 10. In this case, the ground electrode 32 of the filter 30 is electrically connected to the wiring electrode 6c by soldering or die bonding using a conductive material, and is thus grounded. As discussed above, as shown in FIG. 2, the input/output terminals of the filter 30 are connected to the ground electrode 32 for conducting direct current. Accordingly, the input/output terminals of the filter 30 are also connected to the ground electrode 4 of the circuit board 2 for conducting direct current. That is, the wiring electrode 6c of the circuit board 2 connected to the filter 30 is connected to the ground electrode 4 via the through-hole 7 for conducting direct current to/from the filter 30.

Figure 3B:
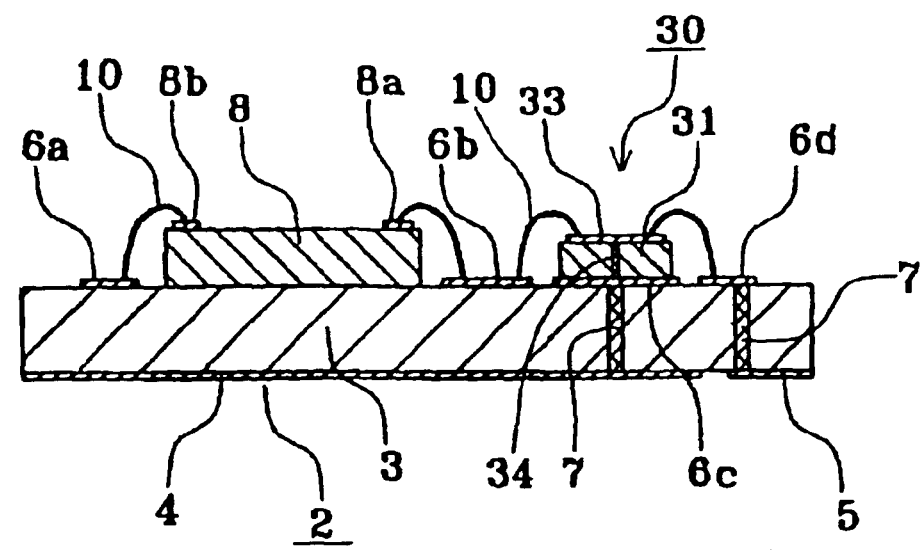
FIG. 3B illustrates the manufacturing process for the high-frequency circuit board unit of the present invention in which a semiconductor device is mounted on the circuit board provided with the filter.

In a second process step, as shown in FIG. 3B, the semiconductor device 8 is mounted on the circuit board 2, and the connecting lands 8a, 8b of the semiconductor device 8 are connected to the wiring electrodes 6b, 6a of the circuit board 2 by the wires 10.

The connecting lands of the semiconductor device 8 include a connecting land 8a, which serves as a high-frequency signal terminal for sending and receiving a high-frequency signal to and from an external source; and a connecting land 8b, which serves as the other terminal, such as a power supply terminal, through which a high-frequency signal is not sent or received.

The connecting land 8a, which is a high-frequency signal terminal of the semiconductor device 8, is coupled to the wiring electrode 6b connected to the filter 30. As discussed in the first process step, the wiring electrode 6b is connected to the ground electrode 4 via the filter 30 for conducting direct current. Accordingly, even if, for example, an electrostatic surge voltage is applied to the terminal electrode 5 for some reason while the semiconductor device 8 is being mounted, it is grounded via the filter 30 before reaching the semiconductor device 8. Thus, the semiconductor device 8 can be protected from electrostatic discharge damage. With this arrangement, it is not necessary to take elaborate measures against electrostatic damage, and thus, the cost of managing the process steps is reduced.

In a preferred embodiment of the process, in order to integrate the die bonding step and the wire bonding step, the connection of the input/output terminals of the filter 30 to the wiring electrodes 6b, 6d on the circuit board 2 by the wires 10 in the first process step is performed after the semiconductor device 8 is mounted on the circuit board 2 and before the connecting lands 8a and 8b of the semiconductor device 8 are connected to the wiring electrodes 6b, 6a by the wires 10 in the second process step. According to this preferred process, the filter 30 has already been mounted when the connecting lands 8a and 8b of the semiconductor device 8 are coupled to the wiring electrodes 6b, 6a by the wires 10. Accordingly, the wiring electrodes 6b, 6d connected to the filter 30 are connected to the ground electrode 4 for conducting direct current via the filter 30. Thus, advantages similar to those obtained by connecting the filter 30 to the wiring electrodes 6b, 6d by wire bonding before the mounting of the semiconductor device 8 can be exhibited.

Referring back to FIG. 1, in the high-frequency circuit board unit 20 constructed as described above, both the terminal electrode 5 of the circuit board 2 and the connecting land 8a, which is the high-frequency signal terminal of the semiconductor device 8, are connected to the ground electrode 4 for conducting direct current via the filter 30. Accordingly, the high-frequency circuit board unit 20 has a high breakdown voltage, and even if an electrostatic surge voltage is applied to the terminal electrode 5 for some reason, electrostatic discharge damage to the semiconductor device 8 does not occur. Thus, the reliability of the high-frequency circuit board unit 20 is improved.

Additionally, the strip line electrode 33 is formed on the dielectric substrate 31 having a dielectric constant higher than that of the dielectric substrate 3 forming the circuit board 2. Thus, the size of the filter 30 can be reduced, and the entire high-frequency circuit board unit 20 thereby be considerably miniaturized.

Figure 4:
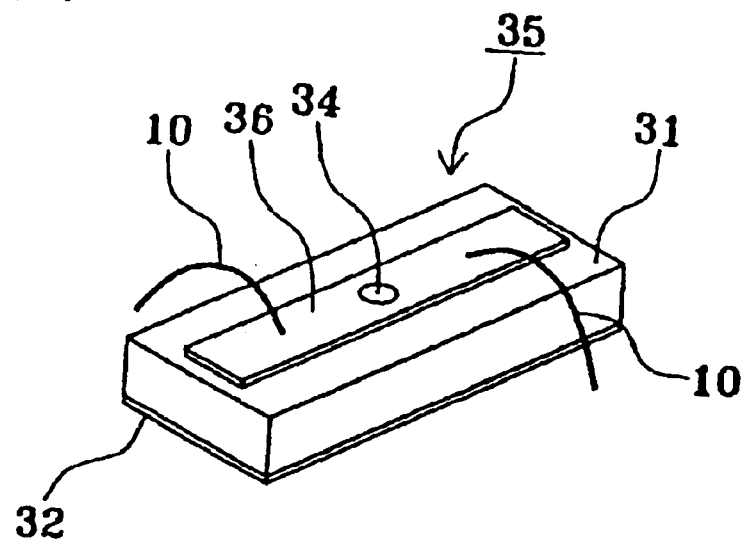
FIG. 4 is a perspective view illustrating another example of the filter mounted on a high-frequency circuit board unit of the present invention.

Another example of a filter, which serves as a passive impedance circuit device, for use in the high-frequency circuit board unit of the present invention is shown in FIG. 4. In FIG. 4, elements the same as or similar to those shown in FIG. 2 are designated with like reference numerals, and an explanation thereof will thus be omitted.

In FIG. 4, a filter 35 includes a linear ½-wavelength strip line electrode 36 on the second main surface of the dielectric substrate 31. The central portion of the strip line electrode 36 is connected to the ground electrode 32 via the through-hole 34. The wires 10 are connected to the strip line electrode 36 at respective positions between the center and the ends of the strip line electrode 36, which positions serve as the input and output terminals.

In the above-configured filter 35, both the ends of the strip line electrode 36 are operated as ¼-wavelength resonators. The two resonators are coupled to each other via an inductance component of the through-hole 34 so that they serve as band-pass filters for allowing specific frequencies to pass there through. Additionally, the central portion of the strip line electrode 36 is connected to the ground electrode 32 via the through-hole 34. Accordingly, the input/output terminals (strip line electrode 36 connected to the input/output wire 10) are connected to the ground electrode 32 for conducting direct current.

Figure 5:
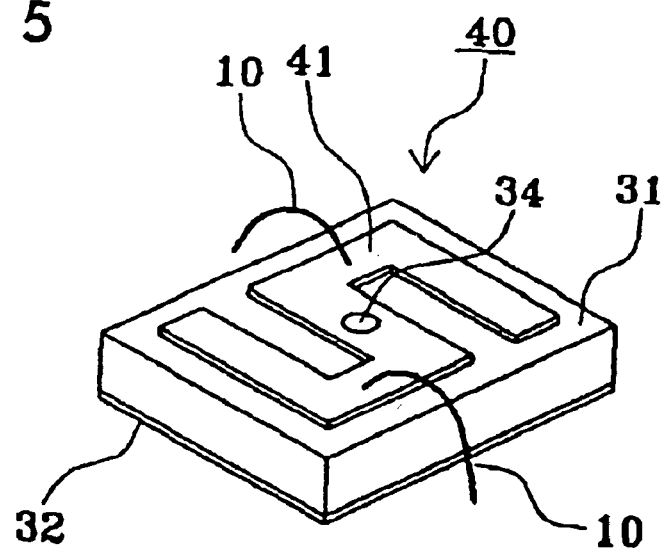
FIG. 5 is a perspective view illustrating still another example of the filter mounted on a high-frequency circuit board unit of the present invention.

FIG. 5 illustrates still another example of the filter, which is a passive impedance circuit device, for use in the high-frequency circuit board unit of the present invention. In FIG. 5, elements the same as or similar to those shown in FIG. 4 are indicated by like reference numerals, and an explanation thereof will thus be omitted.

A filter 40 shown in FIG. 5 is different from the filter 35 shown in FIG. 4 only in that a non-linear or S-shaped strip line electrode 41 is provided instead of the linear strip line electrode 36.

In the above-configured filter 40, the individual portions of the strip line electrode 41 are coupled to each other, thereby improving filtering characteristics, such as reducing spurious characteristics, and also making the filter 40 smaller than the filter 35.

As in the filter 30 shown in FIG. 2, in the filters 35 and 40 shown in FIGS. 4 and 5, respectively, the input/output terminals are connected to the ground electrode 32 for conducting direct current. Accordingly, when the filter 35 or 40 is mounted on the high-frequency circuit board unit of the present invention, advantages similar to those exhibited by the filter 30 can be obtained.

Figure 6:
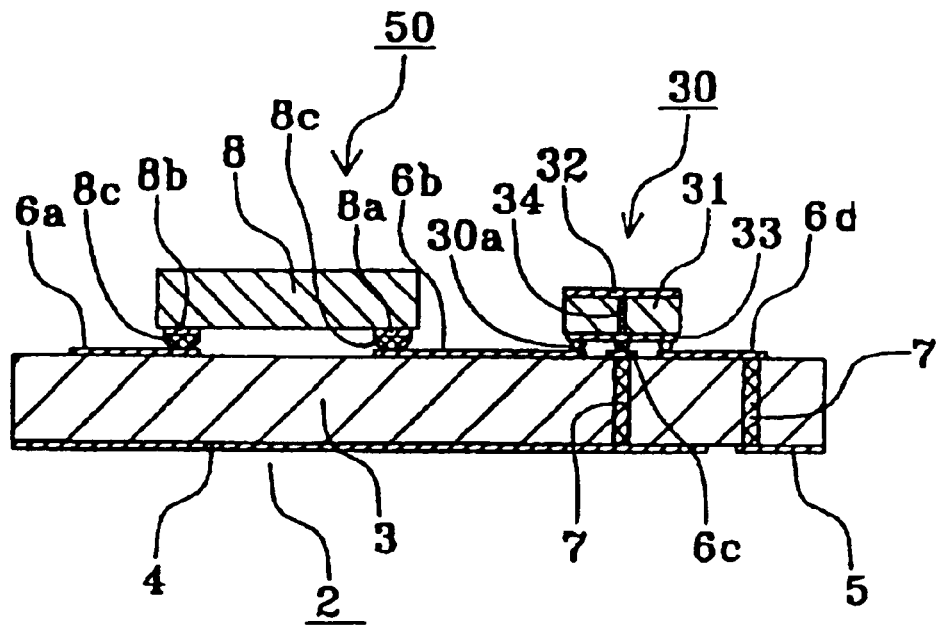
FIG. 6 is a sectional view illustrating a high-frequency circuit board unit according to another embodiment of the present invention.

FIG. 6 is a sectional view illustrating a high-frequency circuit board unit according to another embodiment of the present invention. In FIG. 6, elements the same as or similar to those shown in FIG. 1 are designated with like reference numerals, and an explanation thereof will thus be omitted.

In a high-frequency circuit board unit 50 shown in FIG. 6, the semiconductor device 8 and the filter 30, which is a passive impedance circuit device, are bump-mounted (flip-chip mounted) on the wiring electrodes 6a, 6b, 6c, 6d formed on the second main surface of the dielectric substrate 3. A bump 8c is provided on each of the terminals 8a and 8b of the semiconductor device 8, and the terminals 8a and 8b are connected to the wiring electrodes 6a, 6b via the bumps 8c. In the filter 30, too, three bumps 30a are provided on the strip line electrode 33, and the filter 30 is connected to the wiring electrodes 6b, 6c, 6d via the bumps 30a. With this configuration, the wires (bonding wires) 10 provided for the high-frequency circuit board unit 20 shown in FIG. 1 are not necessary.

As discussed above, in the high-frequency circuit board unit 50, the semiconductor device 8 and the filter 30 are bump-mounted on the wiring electrode 6, thereby eliminating the wire bonding process. This decreases the possibility of causing electrostatic discharge damage.

Figure 7:
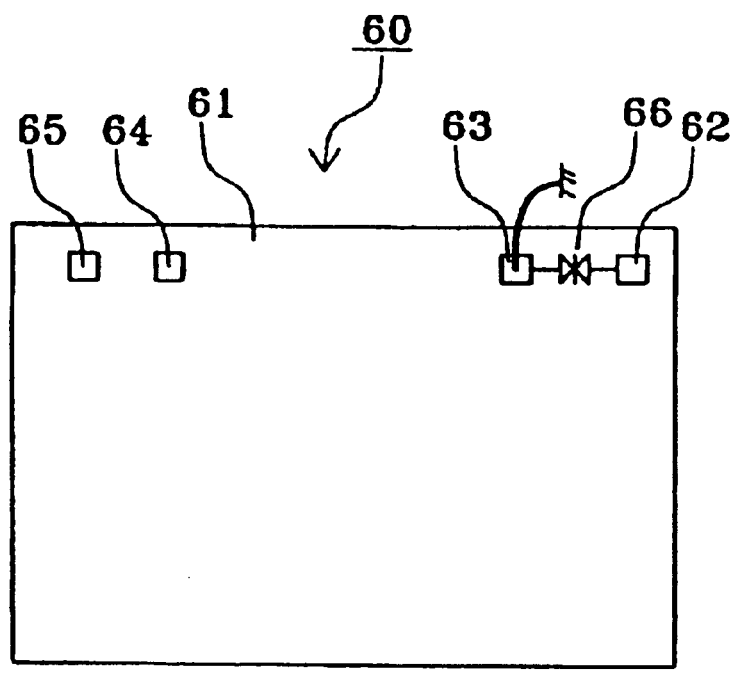
FIG. 7 is a plan view illustrating another example of the semiconductor device mounted on a high-frequency circuit board unit of the present invention.

FIG. 7 is a plan view illustrating another example of a semiconductor device for being mounted on the high-frequency circuit board unit of the present invention. In a semiconductor device 60 shown in FIG. 7, various circuit elements (not shown) and connecting lands 62, 63, 64, and 65 connected to these circuit elements are formed on a semiconductor chip 61. The connecting land 62 serves as a power supply input terminal, the connecting land 63 is used as a ground terminal, and the connecting lands 64 and 65 serve as high-frequency signal terminals. An electrostatic protecting diode 66 is formed between the connecting lands 62 and 63.

By providing the electrostatic protecting diode 66 for the connecting lands 62 and 63, which are not the high-frequency signal terminals, the breakdown voltage against a surge voltage applied to the connecting lands 62 and 63 of the semiconductor device 60 can be increased. Additionally, since an electrostatic protecting diode is not needed for the connecting lands 64 and 65, which are high-frequency signal terminals, the loss of the high-frequency signal due to such diode can be prevented. According to the high-frequency circuit board unit using the above-configured semiconductor device 60, it is possible to reduce the possibility of causing electrostatic discharge damage to the semiconductor device 60 when a surge voltage is applied via a path other than a path for transmitting a high-frequency signal.

In the high-frequency circuit board units of the foregoing embodiments, a filter is used as the passive impedance circuit device. However, another type of device without active filtering characteristics, such as a matching circuit, may be used as the passive impedance circuit device. In this case, advantages similar to those obtained by the filter can also be obtained.

Figure 8:
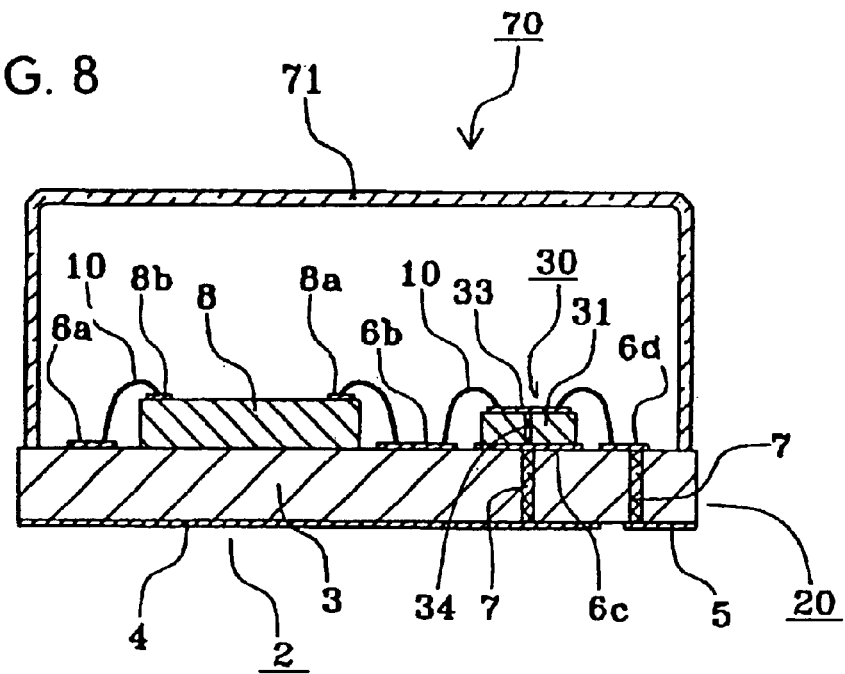
FIG. 8 is a sectional view illustrating a high-frequency module according to an embodiment of the present invention.
Figure 9:
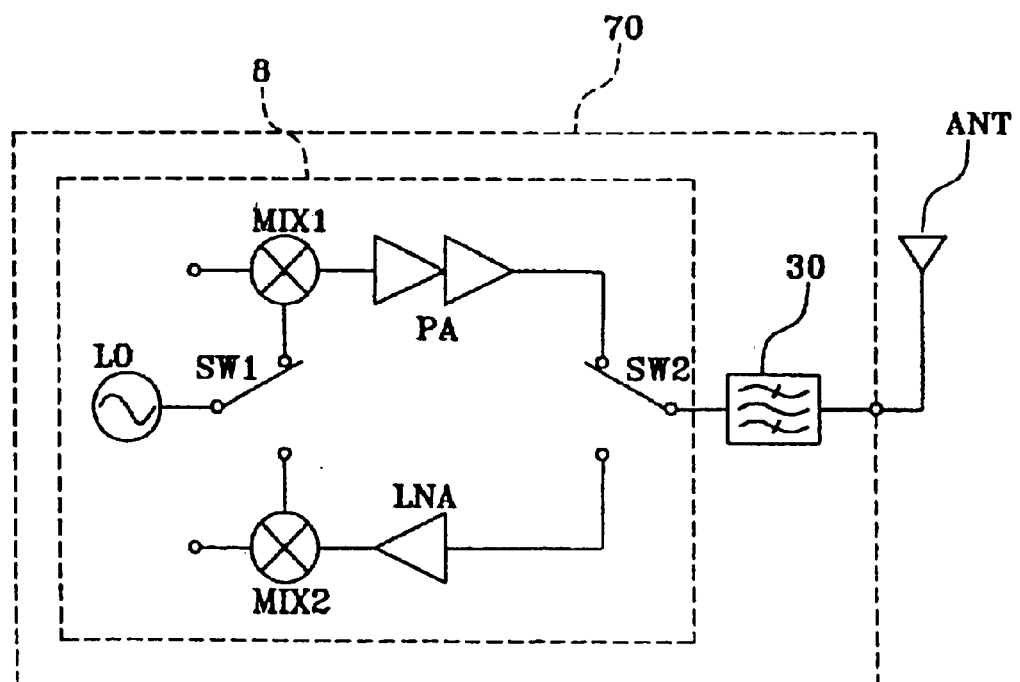
FIG. 9 is a block diagram schematically illustrating the high-frequency module shown in FIG. 8.

FIG. 8 is a sectional view illustrating a high-frequency module according to an embodiment of the present invention. In FIG. 8, elements the same as or similar to those shown in FIG. 1 are indicated by like reference numerals, and an explanation thereof will thus be omitted. FIG. 9 is a block diagram schematically illustrating a wireless communication transceiver module which is one example of high-frequency module of FIG. 8.

In a high-frequency module 70 shown in FIG. 8, a cover 71 for covering the semiconductor device 8 and the filter 30 is placed on the high-frequency circuit board unit 20. In this case, the terminal electrode 5 of the high-frequency circuit board unit 20 serves as an external terminal.

Referring to the block diagram of FIG. 9, the high-frequency module 70 is formed of a local oscillator LO, high-frequency switches SW1 and SW2, mixers MIX1 and MIX2, a power amplifier PA, a low noise amplifier LNA, and the filter 30. Among these elements, the local oscillator LO, the high-frequency switches SW1 and SW2, the mixers MIX1 and MIX2, the power amplifier PA, and the low noise amplifier LNA are formed on the semiconductor device 8.

The local oscillator LO is connected to a first terminal of the high-frequency switch SW1, and second and third terminals of the high-frequency switch SW1 are connected to the mixers MIX1 and MIX2, respectively. The mixer MIX1 is connected to a second terminal of the high-frequency switch SW2 via the power amplifier PA. A first terminal of the switch SW2 is connected via the filter 30 to an antenna ANT separately provided for the high-frequency module 70. A third terminal of the high-frequency switch SW2 is connected to the mixer MIX2 via the low noise amplifier LNA.

The operation of the high-frequency module 70 is briefly discussed below. An IF signal is input into the mixer MIX1 from a transmitter circuit (not shown). When the first terminal of the high-frequency switch SW1 is connected to the second terminal of the switch SW1, a carrier signal is input into the mixer MIX1 from the local oscillator LO. Accordingly, the carrier signal is modulated with the IF signal input into the mixer MIX1, and the resulting signal is output from the mixer MIX1 as an RF signal. The RF signal is then amplified in the power amplifier PA, and is input into the second terminal of the high-frequency switch SW2. The high-frequency switch SW2 is operated in cooperation with the high-frequency switch SW1. More specifically, when the first terminal and the second terminal of the high-frequency switch SW1 are connected, the first terminal and the second terminal of the high-frequency switch SW2 are also connected. Accordingly, the RF signal input into the second terminal of the high-frequency switch SW2 is output from the first terminal. Then, the RF signal is input into the filter 30 in which unwanted signal components are eliminated, and the resulting RF signal is radiated from the antenna ANT as radio waves.

On the other hand, an the RF signal received by the antenna ANT is input into the filter 30 in which unwanted signal components are eliminated. Then, when the first terminals of the high-frequency switches SW1 and SW2 are connected to the corresponding third terminals, the resulting RF signal is input into the low noise amplifier LNA via the high-frequency switch SW2, and is amplified. The RF signal is then input into the mixer MIX2. A carrier signal output from the local oscillator LO has been input into the mixer MIX2 via the high-frequency switch SW1. Thus, the carrier signal components are removed from the RF signal in the mixer MIX2, and the resulting signal is input into a receiver circuit (not shown) as an IF signal.

In the above-configured high-frequency module 70, an electrostatic surge voltage may be applied via the terminal connected to the antenna ANT. However, the surge voltage is shunted to the ground electrode 4 of the circuit board 2 via the filter 30. Thus, the local oscillator LO, the high-frequency switches SW1 and SW2, the mixers MIX1 and MIX2, the power amplifier PA, and the low noise amplifier LNA of the semiconductor device 8 can be protected from electrostatic discharge damage. Accordingly, the high-frequency module 70 can be safely used even in a manufacturing line in which measures against electrostatic discharge damage are not sufficiently taken.

Although not shown in FIG. 9, a protective diode like that in FIG. 7 may be provided as well in the embodiment of FIGS. 8–9 and in any other embodiment of the invention.

Figure 10:
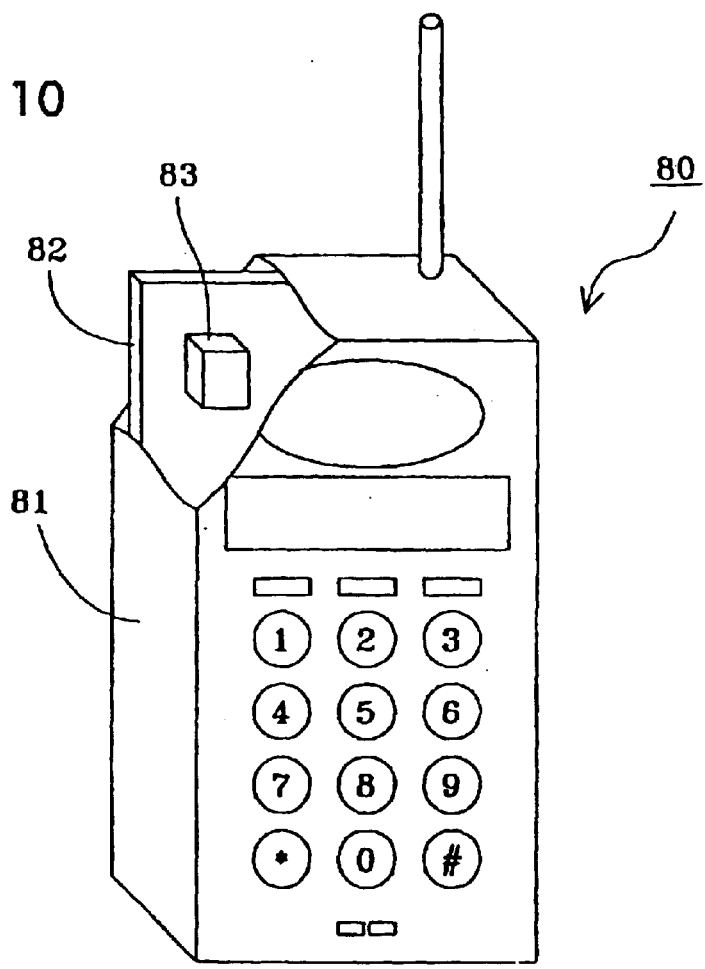
FIG. 10 is a partially cutaway perspective view illustrating an electronic apparatus according to an embodiment of the present invention.

FIG. 10 is a perspective view illustrating an electronic apparatus according to an embodiment of the present invention. In FIG. 10, a cellular telephone 80, which is an example of the electronic apparatus of the present invention, includes a casing 81, a printed board 82 disposed in the casing 81, and a high-frequency module 83 of the present invention mounted on the printed board 82. The high-frequency module 83 is a high frequency component, such as an amplifier, an oscillator, or a filter.

Since the high-frequency module 83 of the present invention is used, the above-configured cellular telephone 80 is protected from electrostatic discharge damage. It is thus possible to simplify the anti-electrostatic measures taken in the manufacturing process, thereby decreasing the cost and improving the reliability.

The cellular telephone 80 shown in FIG. 10 is a mere example of the electronic apparatus of the present invention. The invention includes any electronic apparatus using the high-frequency module of the present invention.

Although the present invention has been described in relation to particular embodiments thereof, many other variations and modifications and other uses will become apparent to those skilled in the art. Therefore, the present invention is not limited by the specific disclosure herein, but only by the appended claims.

What is claimed is:

1. A high-frequency circuit board unit comprising:
    a circuit board including a first surface and a second surface;
    a ground electrode provided on said first surface of said circuit board;
    a terminal electrode provided on said first surface of said circuit board; and
    a semiconductor device mounted on said second surface of said circuit board, said semiconductor device including a high-frequency signal terminal for sending and receiving a high-frequency signal to and from said terminal electrode of said circuit board, and a non-high-frequency signal terminal located on said semiconductor device,
    wherein said non-high-frequency signal terminal is not connected to any terminal electrode on said first surface of said circuit board so as to be isolated from receipt of a surge voltage, and
    wherein at least one of said terminal electrode and said high-frequency signal terminal of said semiconductor device is connected to said ground electrode for conducting direct current.

2. A high-frequency circuit board unit according to claim 1, further comprising a passive impedance circuit device mounted on said circuit board and connected between said high-frequency signal terminal and said terminal electrode, wherein one of said high-frequency signal terminal and said terminal electrode is connected to said ground electrode for conducting direct current via said passive impedance circuit device.

3. A high-frequency circuit board unit according to claim 1, further comprising a passive impedance circuit device mounted on said circuit board and connected between said high-frequency signal terminal and said terminal electrode, wherein both said high-frequency signal terminal and said terminal electrode are connected to said ground electrode for conducting direct current via said passive impedance circuit device.

4. A high-frequency circuit board unit according to one of claims 2 and 3, wherein said passive impedance circuit device is formed on a dielectric substrate having a dielectric constant higher than that of both said circuit board and said semiconductor device.

5. A high-frequency circuit board unit according to one of claims 2 and 3, wherein said semiconductor device is bump-mounted on said circuit board.

6. A high-frequency circuit board unit according to any one of claims 1 to 3, further comprising an additional terminal other than said high-frequency signal terminal on said semiconductor device, and an electrostatic protecting diode connected to said additional terminal.

7. An electronic apparatus comprising said high-frequency circuit board unit set forth in any one of claims 1 to 3.

8. A high-frequency module comprising said high-frequency circuit board unit set forth in any one of claims 1 to 3, further comprising a cover mounted on said second surface of said circuit board.

9. An electronic apparatus comprising said high-frequency module set forth in claim 8.

10. A manufacturing method for a high-frequency circuit board unit, the manufacturing method comprising:
    mounting a passive impedance circuit device on a first surface of a circuit board, said circuit board including a ground electrode and a terminal electrode provided on a second surface thereof, wherein at least one terminal of said passive impedance circuit device is connected to said ground electrode and said terminal electrode for conducting direct current; and
    mounting a semiconductor device including a high-frequency signal terminal and a non-high-frequency signal terminal on said first surface of said circuit board in such a manner that said high-frequency signal terminal is connected to a second terminal of said passive impedance circuit device, and said non-high-frequency signal terminal is not connected to any terminal electrode on said second surface of said circuit board so as to be is isolated from receipt of a surge voltage.

11. A manufacturing method for a high-frequency circuit board unit according to claim 10, wherein said passive impedance circuit device and said semiconductor device are bump-mounted on said circuit board.

12. A manufacturing method according to claim 10, wherein said at least one terminal of said passive impedance circuit device is connected to said ground electrode after said semiconductor device is mounted on said circuit board.

13. A manufacturing method according to claim 12, wherein said at least one terminal of said passive impedance circuit device is connected to said ground electrode before said high-frequency signal terminal is connected to said second terminal of said passive impedance circuit device.

* * * * *